(12) United States Patent
Stinnett

(10) Patent No.: US 12,070,808 B2
(45) Date of Patent: Aug. 27, 2024

(54) TRIBOLOGICAL OPTIMIZED CUTTER TOOL FOR MILLING TITANIUM OR TITANIUM ALLOYS

(71) Applicant: LOCKHEED MARTIN CORPORATION, Bethesda, MD (US)

(72) Inventor: Thomas C. Stinnett, Dallas, TX (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 1066 days.

(21) Appl. No.: 16/965,198

(22) PCT Filed: Feb. 4, 2019

(86) PCT No.: PCT/US2019/016531
§ 371 (c)(1),
(2) Date: Jul. 27, 2020

(87) PCT Pub. No.: WO2019/152936
PCT Pub. Date: Aug. 8, 2019

(65) Prior Publication Data
US 2021/0060669 A1    Mar. 4, 2021

Related U.S. Application Data

(60) Provisional application No. 62/625,465, filed on Feb. 2, 2018.

(51) Int. Cl.
*B23C 5/28* (2006.01)
*C23C 14/02* (2006.01)
*C23C 14/16* (2006.01)

(52) U.S. Cl.
CPC .............. *B23C 5/28* (2013.01); *C23C 14/021* (2013.01); *C23C 14/024* (2013.01); *C23C 14/16* (2013.01);

(Continued)

(58) Field of Classification Search
None
See application file for complete search history.

(56) References Cited

U.S. PATENT DOCUMENTS 5,709,907 A * 1/1998 Battaglia ............... B23B 27/146
                                                        427/419.7
7,226,670 B2 * 6/2007 Derflinger ........... C23C 14/0641
                                                        428/408

(Continued)

FOREIGN PATENT DOCUMENTS

| CN | 106191765 A | * | 12/2016 | |
| JP | 2007260856 A | * | 10/2007 | |
| WO | WO-2010150411 A1 | * | 12/2010 | ........... B23C 5/1009 |

*Primary Examiner* — Seth Dumbris
(74) *Attorney, Agent, or Firm* — Terry M. Sanks, Esq.; Beusse Sanks, PLLC

(57) ABSTRACT

A coating comprising a bottom layer comprising a hard physical vapor deposition (PVD) coating applied to the end mill. The bottom layer has an edge-prep and polished top surface with reoriented cutting forces. The coating includes a top layer comprising a friction reducing coating applied to the top surface of the bottom layer to prevent or minimize titanium or titanium alloy adhesion to the end mill during milling operations of a metal object comprising the titanium or titanium alloy. The coating has a chemical composition which has inertness toward titanium or titanium alloy. A cutter tool and method are also provided.

22 Claims, 13 Drawing Sheets

(52) U.S. Cl.
  CPC ...... *B23C 2224/14* (2013.01); *B23C 2226/12* (2013.01); *B23C 2228/08* (2013.01); *B23C 2228/10* (2013.01)

(56) References Cited

U.S. PATENT DOCUMENTS

| | | |
|---|---|---|
| 8,715,838 B2 | 5/2014 | Okada et al. |
| 2013/0051937 A1* | 2/2013 | Volokh ................. B23C 5/1045 407/42 |
| 2013/0052477 A1 | 2/2013 | Lechthaler et al. |
| 2013/0157023 A1 | 6/2013 | Ni et al. |
| 2014/0248100 A1* | 9/2014 | Krassnitzer ........... C23C 14/345 204/192.15 |
| 2017/0209936 A1 | 7/2017 | Kanaoka et al. |

\* cited by examiner

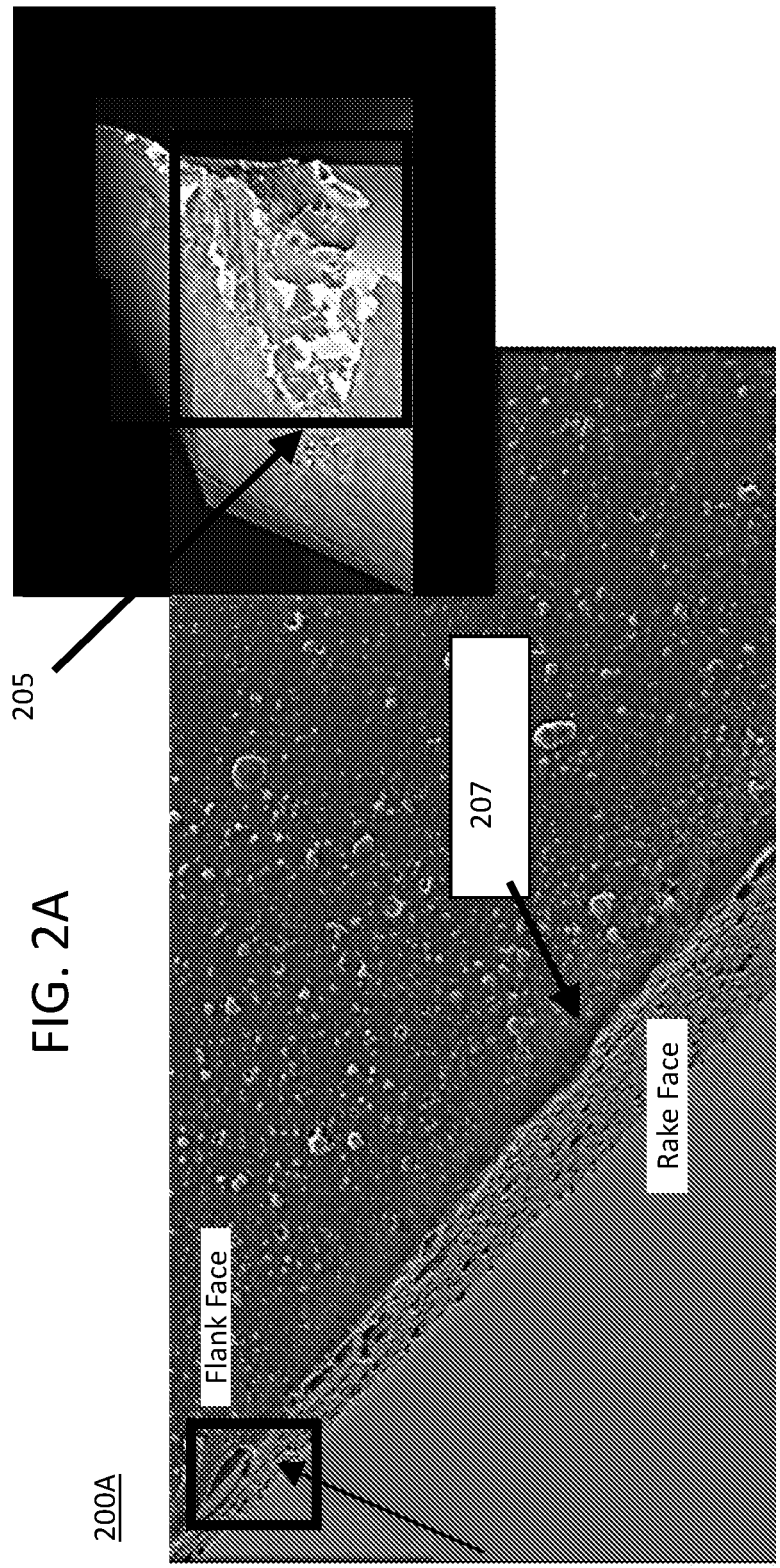

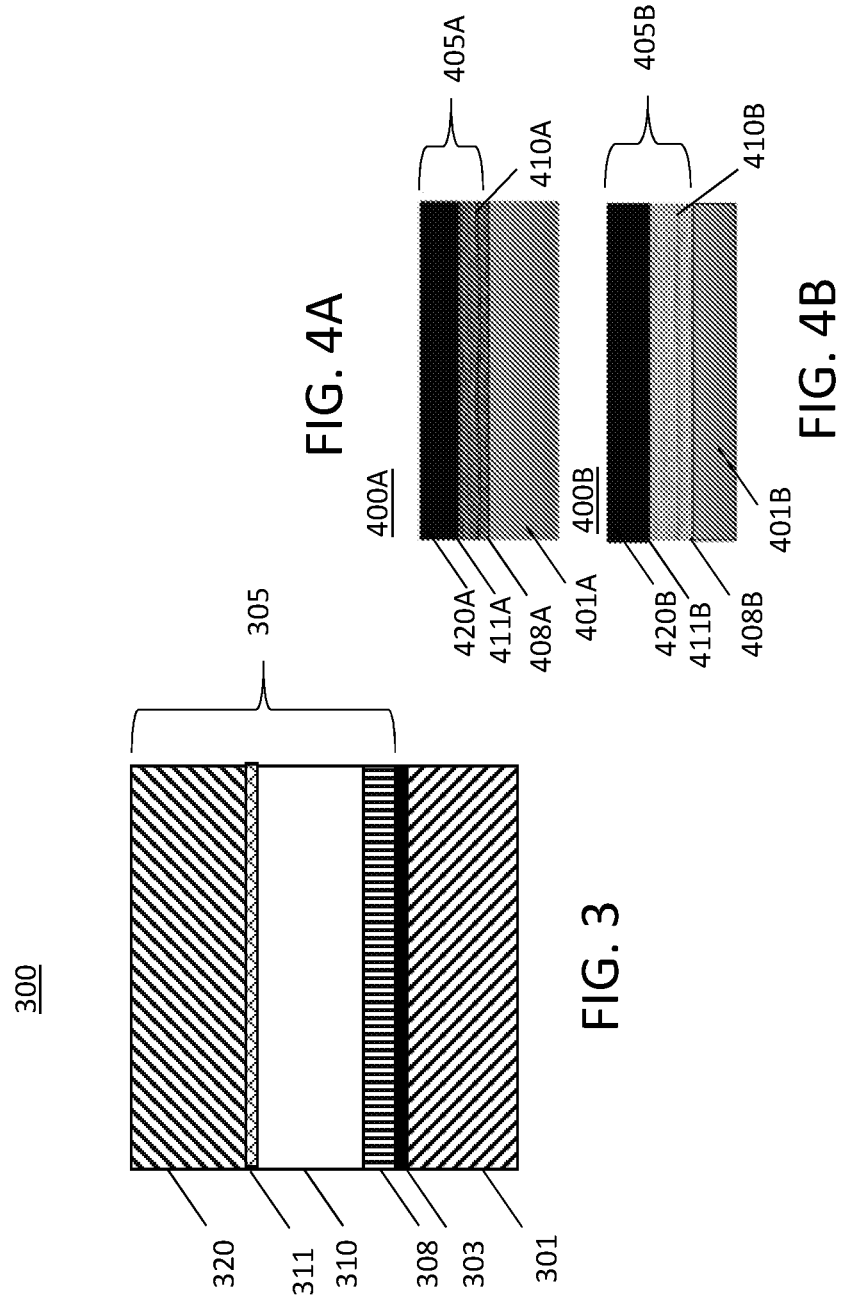

TRIBOLOGICAL OPTIMIZED CUTTER TOOL FOR MILLING TITANIUM OR TITANIUM ALLOYS

CROSS-REFERENCE TO RELATED APPLICATIONS

This application claims the benefit of U.S. Provisional Application No. 62/625,465 filed Feb. 2, 2018, titled "TRIBOLOGICAL OPTIMIZED CUTTING TOOL FOR MILLING TITANIUM OR TITANIUM ALLOYS" and incorporated herein by reference in its entirety.

BACKGROUND

Embodiments relate to a tribologically optimized (TO) cutter tool and method of tribologically optimizing the cutter tool.

While strong material for making industrial products is desirable, there have been various challenges with cutters for milling difficult-to-machine materials, such as titanium or titanium alloys. A challenge is between having to choose either a high material removal rate (MRR) with a short cutter life or a low MRR with a long cutter life. The capability of having both high removal rates and extended tool lives will be advantageous for machine shops engaged in aerospace manufacturing, for example.

The purpose of the invention is to improve upon existing cutter tool designs.

SUMMARY

Embodiments relate to a tribologically optimized cutter tool and method of tribologically optimizing the cutter tool. The embodiments have applications for hard to mill materials such as titanium or titanium alloys.

An aspect of the embodiments includes a method comprising applying to an end mill an abrasion-resistant bottom coating (ARBC) layer on an outer perimeter surface of the end mill, the ARBC layer has chemical inertness toward titanium or titanium alloy. The method comprises edge-prepping and polishing a top surface of the ARBC layer to form a polished ARBC layer with reoriented cutting forces; and applying a friction reducing coating (FRC) layer to the top surface of the polished ARBC layer to form a thin-film coating which has chemical inertness to titanium or the titanium alloy.

Another aspect of the embodiments includes a cutter tool comprising an end mill having an altered secondary relief with a standard style relief. The cutter tool comprises a duplex coating applied to the end mill having a bottom layer comprising an abrasion-resistant bottom coating (ARBC). The bottom layer has an edge-prep and polished top surface with reoriented cutting forces. A top layer comprises a friction reducing coating applied to the top surface of the bottom layer. The duplex coating includes a chemical composition which is inert toward titanium or titanium alloy to prevent or minimize titanium or titanium alloy adhesion to the end mill during milling operations of a metal object comprising the titanium or titanium alloy.

A still further aspect of the embodiments includes a coating comprising a bottom layer comprising a hard physical vapor deposition (PVD) coating applied to the end mill. The bottom layer has an edge-prep and polished top surface to reorient cutting forces. The coating includes a top layer comprising a friction reducing coating applied to the top surface of the bottom layer. The coating includes a chemical composition which is inert toward titanium or titanium alloy to prevent or minimize titanium or titanium alloy adhesion to the end mill during milling operations of a metal object comprising the titanium or titanium alloy.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIG. 2A illustrates an image of the end mill's coating with microchipping and rough surface topography highly magnified;

FIG. 2B illustrates an image of the damaged end mill's coating of FIG. 2A with the microchipping and adhered workpiece titanium magnified;

FIG. 3 illustrates a diagram of cutter tool layers of an end mill with a thin-film coating;

FIG. 4A illustrates a diagram of cutter tool layers for a first implementation of the thin-film coating;

FIG. 4B illustrates a diagram of cutter tool layers for a second implementation of the thin-film coating;

DETAILED DESCRIPTION

Embodiments are described herein with reference to the attached figures. The figures are not drawn to scale, and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Figure 1A:
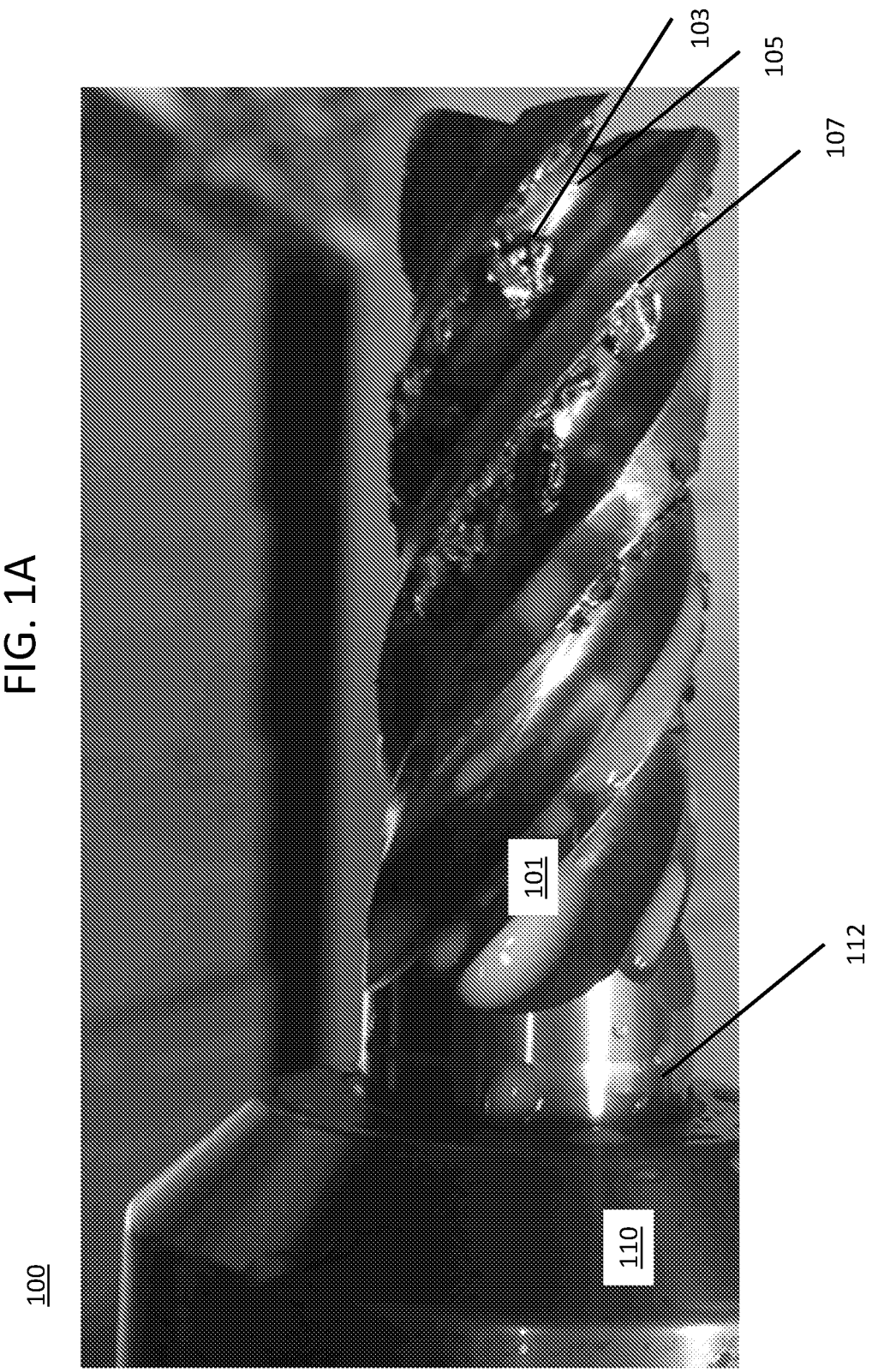
FIG. 1A illustrates an image of a damaged end mill mounted to an existing cutting tool device.

FIG. 1A illustrates an image 100 of a damaged end mill 101 mounted to an existing cutting tool device 110. The image 100 depicts the end mill 101 having titanium adhesions 103 adhering to the exterior surface of the end mill 101 as a result of milling a metal object comprising titanium (Ti) or titanium alloy. The buildup of titanium adhesions 103 causes milling operations to fail, such as when attempting a high material removal rate (MRR), as will be discussed in more detail in relation to FIG. 9. At least the titanium adhesions 103 and/or microchipping is a resultant damage to the end mill from the operation of milling.

The terms "end mill," "cutter tool" and "end mill cutter tool" may be used interchangeably herein. The cutting tool device is the milling machine which rotates the "end mill."

The titanium adhesions 103 bond to and buildup on the end mill surface during milling operations which causes deformation of the cutting edge 107 in addition to the deformation caused by surface wear from metal-on-metal milling. The deformation caused by adhesions effects the precision of the milling. In certain industries, milling precision is essential to product manufacturing. Thus, the titanium adhesions 103 limit the useful life of the end mill 101 as continued milling with a defective cutting edge 107 would cause defects or a reduction of precision in milled elements in the milled object.

As shown, the titanium adhesions 103 may buildup in the flute 105 of the end mill 101 as well as to (or in proximity to) the cutting edge 107. The flute 105 allows debris (metal particles) of the milled object being removed, as the result of the milling process. The flute 105 channels the milled debris away from the object and from the end mill 101 itself. The milled debris being titanium (Ti) or titanium alloy may adhere to the surface of the end mill 101 within the channel of flute 105 and/or to other surfaces of the end mill 101. The buildup of the milled debris forms the titanium adhesions 103 in the flutes 105, as shown in FIG. 1A. The titanium adhesions 103 may compromise the flow of the milled metal particles to move through the flute and away from the metal object. In some instances, a portion of the newly milled metal particles may build up by adhering to the titanium adhesions 103 in the path of or in contact with newly milled metal particles within the channel of the flute 105.

The end mill 101 includes a shaft 112 at a first end which is to be mounted to the cutting tool device 110. The second end of the end mill 101 is a cutting end with the flutes 105 and cutting edge 107.

FIG. 2A illustrates an image 200A of an unused and highly magnified end mill coating with rough surface topography and microchipping, such as along the rake face. FIG. 2B illustrates an image 200B of the damaged end mill's coating of FIG. 2A, with the microchipping area magnified. The area denoted in box 205 represents the flaking of the coating (i.e., microchipping). For the purpose of discussion, the image 200B is magnified based on a factor of 50 times relative to the image 200A.

The inventor has determined that existing end mill coatings are rough and contain microchipping which may cause problems when machining titanium (Ti) or titanium alloy metals. Specifically, machining titanium or titanium causes adhesions to build up on existing end mills or existing end mill coatings which comprise titanium (Ti). An existing coating may include titanium aluminum nitride (TiAlN), by way of example. The adhesions shorten the cutter tool's life and would lead to need for replacement. Additionally, the adhesions may build up on the cutting edges 207 of the cutter tool which in turn cause defects in a milled surface.

FIG. 3 illustrates a diagram 300 of cutter tool 301 layered with a thin-film coating 305. The base layer 301 of the diagram 300 corresponds to the main tool substrate of the end mill, represented as a first diagonal-line hatch pattern. The base layer 301 is a base substrate for the application of the thin-film coating 305. The base layer 301 may be comprised of a composite material such as a tungsten carbide (WC) type material. For example, the base layer 301 may include tungsten carbide composite material (WC—Co), or a cemented carbide composite. The base layer 301 may include tungsten carbine (WC) particles. In an embodiment, the base layer 301 includes tungsten carbide composite material (WC—Co) with a binder containing cobalt (Co) to bind the WC particles together. The end mill may include other types of composite materials for milling metal objects.

In the diagram 300, the thin-film coating 305 includes a first coating layer 310 which may be an abrasion resistant coating (ARC) layer. The first coating layer 310 is represented as a solid white layer. The thin-film coating 305 may include a second coating layer 320 which may be a friction reducing coating (FRC) layer. The second coating layer 320 is represented as a second diagonal-line hatch pattern wherein the first diagonal-line hatch pattern is opposite the direction of the second diagonal-line hatch pattern. The main tool substrate (i.e., base layer 301) includes modified edges, denoted at reference numeral 303. The modified edges 303 are represented as a solid black layer.

While, the modified edge 303 is represented in the layering in diagram 300, the top surface of the base layer 301 may not be modified at other locations. In this instance, the layer denoted at 303 may be omitted. The modified edge 303 is still made of the same material as the base layer 301 but demarcated from the base layer 301 for discussion purposes.

A top surface of the first coating layer 310 is prepped and polished to form a prepped and polished (PP) layer, denoted at reference numeral 311, prior to the application of the second coating layer 320. The PP layer 311 is denoted as a cross-hatching pattern. The first coating layer 310 and second coating layer 320, and any intermediate layers therebetween, form the thin-film coating on the main tool substrate (i.e., base layer 301).

The coating 305, the first coating layer 310 and the second coating layer 320 include a chemical composition which is inert toward titanium or titanium alloy to prevent or minimize titanium or titanium alloy adhesion to the end mill during milling operations of a metal object comprising the titanium or titanium alloy. Each of the first coating layer 310 and the second coating layer 320 may include one or more sub-layers.

The thin-film coating 305 may be applied to the base layer 301 by the application of an adhesive layer 308. The adhesive layer 308 is denoted as a straight-line hatching pattern. The adhesive layer 308 may be needed depending on the first coating layer 310 used in the thin-film coating 305. The chemical composition of some first coating layers may be applied directly to the base layer 301. In other embodiments, the chemical composition of the adhesive layer 308 is inert toward titanium or titanium alloys. In other embodiments, an adhesive layer 308 may include titanium or a titanium alloy. However, a titanium-based adhesive layer 308 should be completely surrounded by the coating as an exposed titanium-based adhesive layer 308 would promote titanium adhesions to form from milled metal particles of the milled object. In some embodiments, the adhesive layer 308 may be part of the thin-film coating 305.

The material composition of the thin-film coating 305 (i.e., combination of the first coating layer 310 and the second coating layer 320) may be applicable to titanium machining. The thin-film coating 305 may include two coatings or a duplex coating to form the two coating layers. By way of non-limiting example, the two coating layers include a bottom layer (i.e., the first coating layer 310) which is configured to be a tough, abrasion resistant coating layer of approximately ~4 to 5 microns. The coating may include a top layer (i.e., the second coating layer 320) above the bottom layer (i.e., the first coating layer 310). The top layer (i.e., the second coating layer 320) is a chemically inert, friction reducing coating layer of approximately 0.5-1.0 micron. Between the top layer (i.e., the second coating layer 320) and the bottom layer (i.e., the first coating layer 310) may include a polished intermediate segment (i.e., top surface 311) on an edge of the cutter tool to reorient cutting forces. The total thickness of the thin-film coating 305 is in the range of approximately 4.5-6.0 microns. Other thicknesses of each coating layer may be used.

FIG. 4A illustrates a diagram 400A of cutter tool layers for a first implementation of the thin-film coating 405A. The base layer 401A includes the main tool substrate. The base layer 401A may be comprised of a tungsten carbide (WC) type material or tungsten carbide composite material (WC—Co). The top surface of the base layer 401A may have an adhesive layer 408A applied thereto. The first coating layer 410A may include an abrasion resistant layer such as aluminum chromium nitride (AlCrN) based coating. The AlCrN based coating may be a hard physical vapor deposition (PVD) coating. The second coating layer 420A may be a friction reducing layer, such as tungsten disulfide ($WS_2$) as a solid lubricant. In some embodiments, the first coating layer 410A may include zirconium nitride (ZrN) based coating. By way of non-limiting example, the ZrN is a nanostructured coating layer. An example, of a zirconium nitride (ZrN) based coating includes a chemical composition of zirconium silicon carbon nitride (ZrSiCN). The abrasion resistant layer resists abrasion especially at those locations where the second coating layer 420A may be compromised during milling as the result of cutting metal.

The base layer 401A is processed to include modified edges (flank face) prior to the application of the first coating layer 410A. The top surface 411A of the first coating layer 410A is prepped and polished prior to the application of the second coating layer 420A.

FIG. 4B illustrates a diagram 400B of cutter tool layers for a second implementation of the thin-film coating 405B. The base layer 401B includes the main tool substrate. The base layer 401B may comprise a tungsten carbide (WC) type material or tungsten carbide composite material (WC—Co). The top surface of the base layer 401B may have an adhesive layer 408B applied thereto. The first coating layer 410B may include an abrasion resistant layer such as aluminum chromium nitride (AlCrN) based coating. The AlCrN may be a physical vapor deposition (PVD) coating. The second coating layer 420B may be a friction reducing layer, such as hexagonal-Boron Nitride (h-BN). In some embodiments, the first coating layer 410B may include zirconium nitride (ZrN) based coating. By way of non-limiting example, the ZrN is a nanostructured coating layer. In some embodiments, the first coating layer 410A or 410B does not include titanium or a titanium alloy. In some embodiments, the second coating layer 420A or 420B does not include titanium or a titanium alloy.

The base layer 401B is processed to include modified edges prior to the application of the first coating layer 410B. The top surface 411B of the first coating layer 410B is prepped and polished prior to the application of the second coating layer 420B.

The solid lubricant of the second coating layer 420A or 420B may include other chemical compositions having a chemical composition which has inertness towards titanium (Ti). The abrasion resistant layer of the first coating layer 410A or 410B may also include other chemical compositions having a chemical composition which has inertness towards titanium (Ti).

The cutting edges of the base layers 401A and 401B may both be modified as will be described in relation to FIG. 6A. The adhesive layers 408A and 408B may be applied to the base layers 401A and 401B, respectively, after the cutting edges are modified.

Figures 5A, 5B:
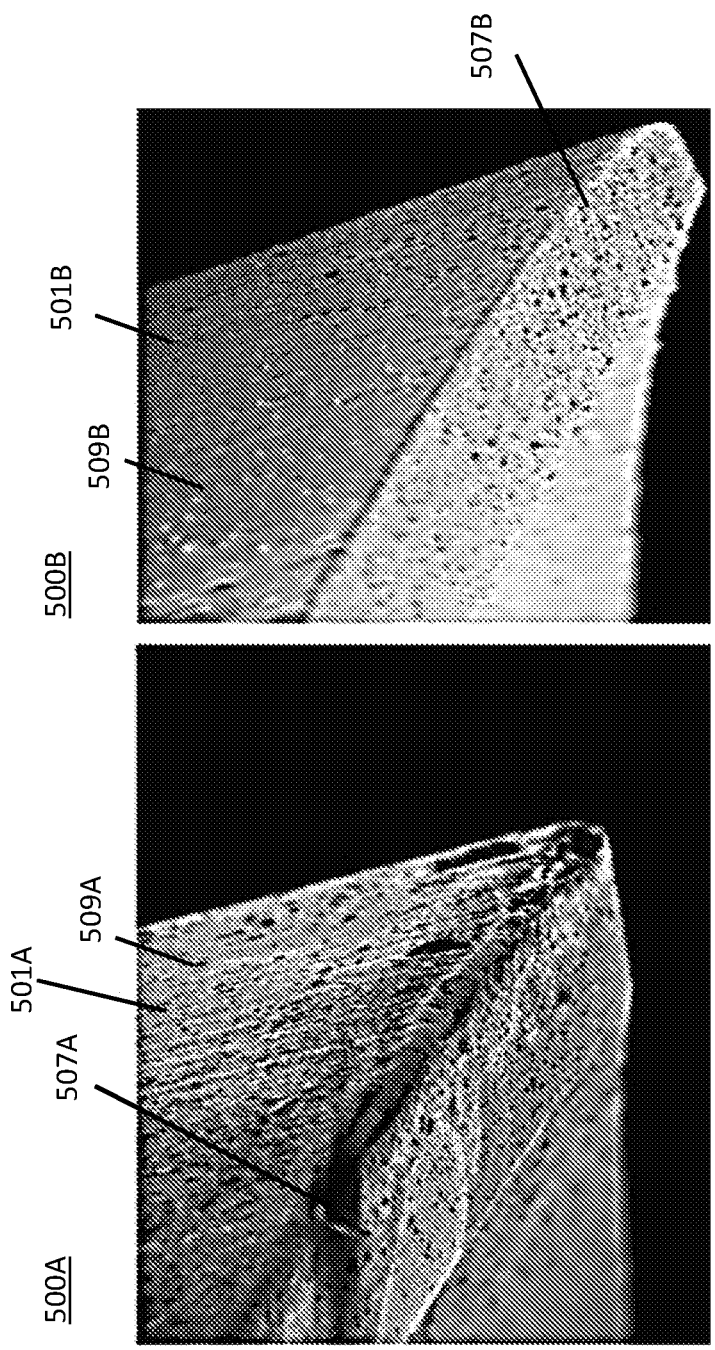
FIG. 5A illustrates an image of an edge-prepped surface of a known tool substrate.
FIG. 5B illustrates an image of an edge prepared with a standard facet on a flank face.

FIG. 5A illustrates an image 500A of an edge-prepped surface 507A of a known tool substrate 501A of a flank face 509A. FIG. 5B illustrates an image 500B of the main tool substrate 501B with a cutting edge 507B prepared with a standard facet of the flank face 509B with an up-sharp cutting edge, according to an aspect of some embodiments described herein. FIGS. 5A and 5B are based on a factor of 750 times magnification.

Figure 6A:
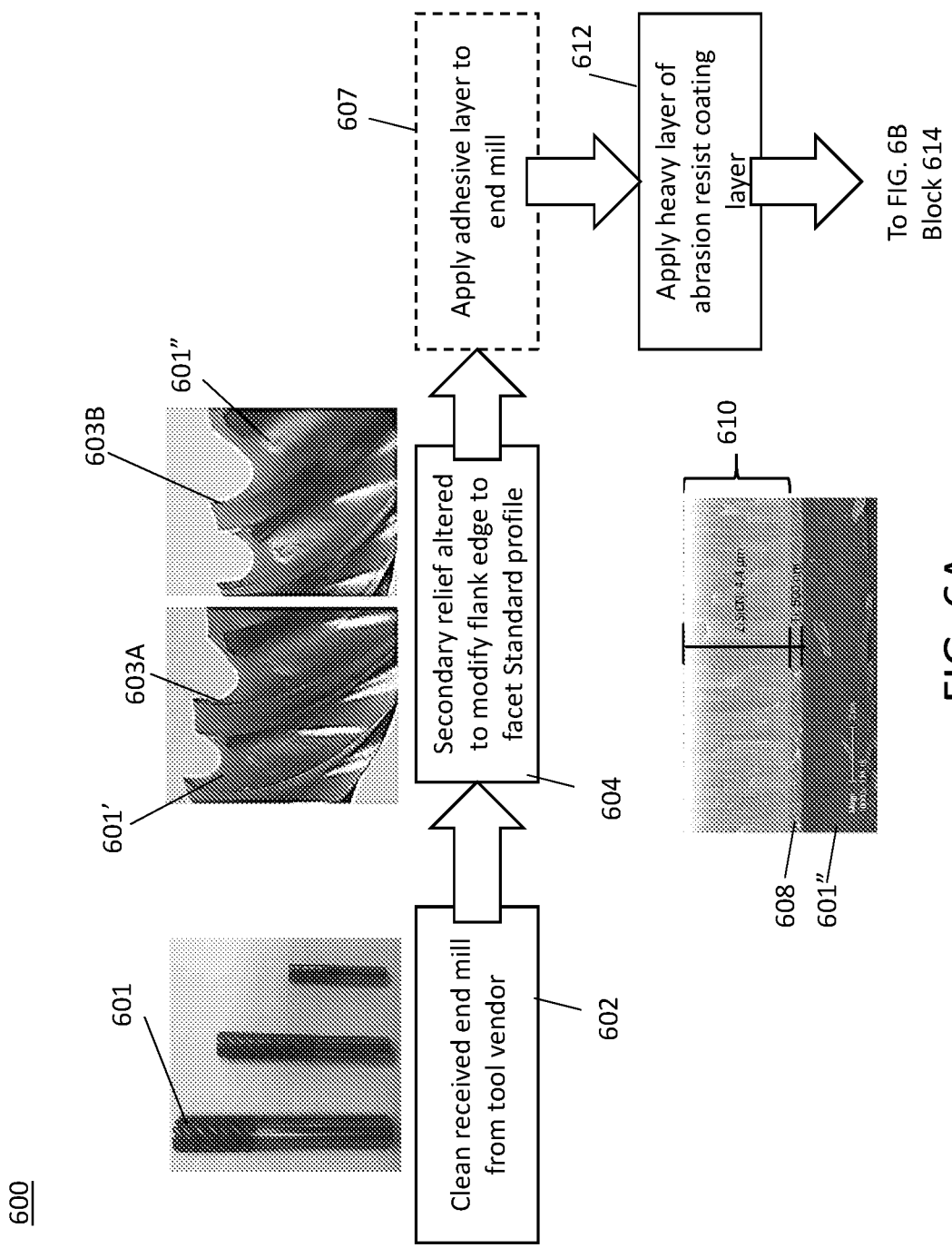
FIGS. 6A and 6B illustrate a flow diagram of the method for forming a tribologically optimized (TO) cutter tool.
Figure 6B:
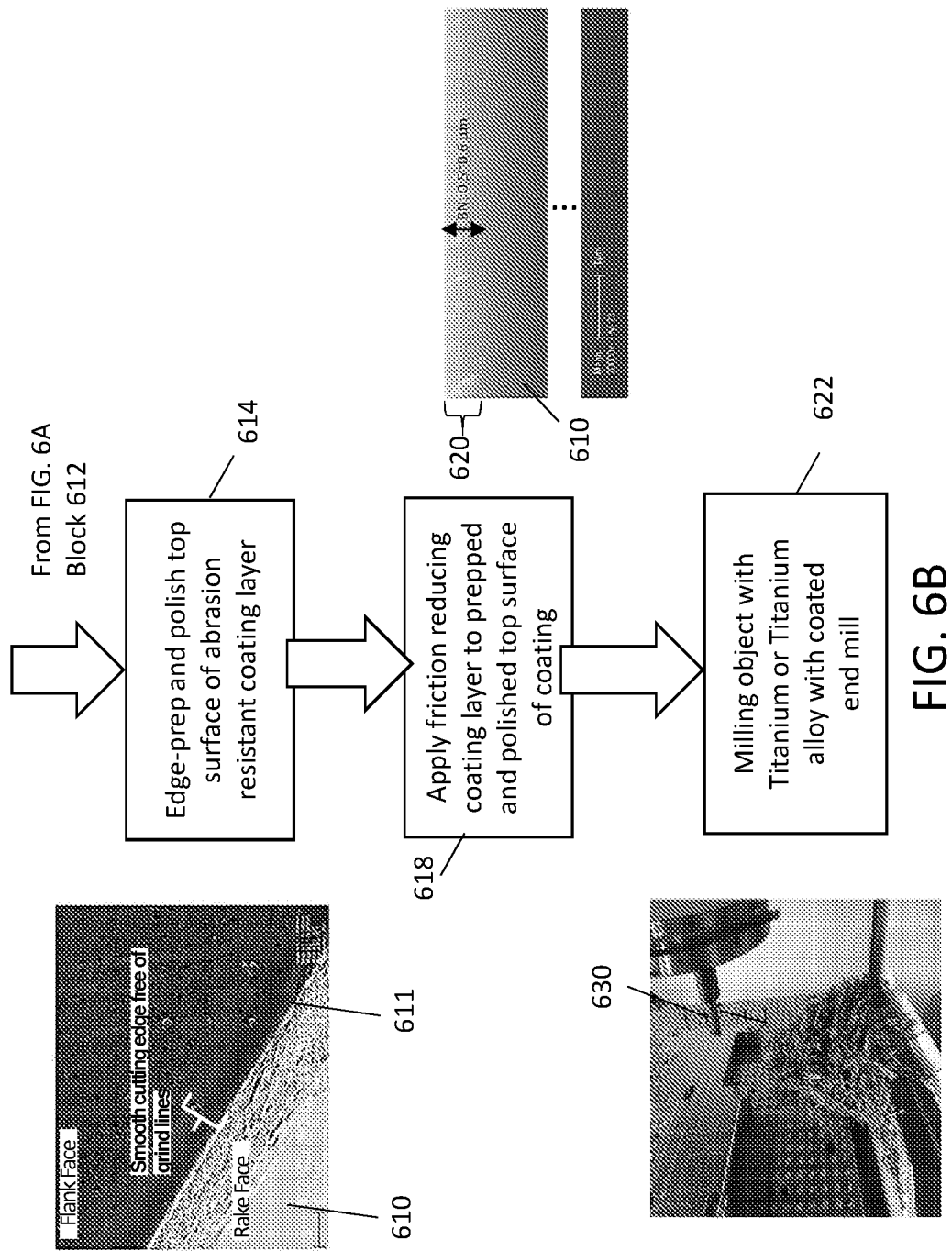

FIGS. 6A and 6B illustrate a flow diagram of the method 600 for forming a tribologically optimized (TO) cutter tool. With reference to FIG. 6A, the cutter tool 601 may have a diameter and a number of flutes. By way of example, the cutter tool 601 may be a ½"-1" diameter, solid carbide end mill. Other diameters may be used. The cutter tool may have 5-11-flutes, for example. The number of flutes may vary. The method 600 may include, at block 602, cleaning a received end mill cutter tool 601. For the sake of description, assume the outer perimeter surface of the received end mill does not include a coating. By way of non-limiting example, exposure of the end mill cutter tool 601 to the ambient environment may cause oxides to form or adhere to the outer perimeter surface of the material of the received end mill cutter tool 601. Thus, the raw end mill is cleaned such as by argon (Ar) ions through ion bombardment and/or hydrogen (H) plasma containing hydrogen in atomic, ionic, and excited states through metal oxide reduction. However, the cleaning of the raw end mill cutter tool should be limited to the oxides such that the material of the end mill cutter tool is generally not removed or reduced. In other words, the end mill cutter tool when being cleaned will essentially return the environmentally exposed outer perimeter surface to the original outer perimeter surface to which the duplex coating, described herein, is to be applied. The cleaned cutter tool will be denoted by the reference numeral 601'.

At block 604, the method 600 may include altering the secondary relief 603A to modify the facet to a standard style relief 603B. Most end mills (i.e., cutter tool 601) used to machine titanium or titanium alloy have an "eccentric" style grind for additional support of the cutting edge. The eccentric style grind or other grind may be altered to a standard/facet style relief 603B of the flank face which reduces rubbing and frictional forces, and thereby reducing cutting forces. Thus, prior to applying the bottom layer of the thin-film coating, because of the reorienting of the cutting forces from a unique style edge-prep, relief angles may be altered and redesigned for optimal machining performance. The cutter tool with the standard/facet style relief 603B, with be denoted by the reference numeral 601".

The method 600 may include, at block 607, applying an adhesive layer 608 to the cleaned and modified end mill cutter tool 601". The adhesive layer 608 is an optional layer and may depend on the type of chemical composition of the abrasion resistant coating layer relative to the chemical composition of the end mill 601. The block 607 is denoted in a dashed line pattern to denote that this block may be optional. By way of non-limiting example, aluminum chromium nitride (AlCrN) based layer may be applied directly to the outer perimeter surface of the end mill 601" comprising tungsten carbide composite material (WC—Co) without the need for an intermediate adhesive layer. However, an adhesive layer 608 may be used for other chemical compositions such as when applying a zirconium nitride (ZrN) based layer to the outer perimeter surface of the end mill comprising tungsten carbide composite material (WC—Co).

The method 600 may include, at block 612, applying a heavy layer of abrasion resistant coating layer 610, the first coating layer of the duplex coating. The term "heavy layer" means the coating layer 610 is applied heavily or in excess so that is can be polished which results in removal of any excess of the abrasion resistant coating layer 610 originally applied. This allows the abrasion resistant coating layer 610 to be edge-prepped and polished without compromising the efficacy of the abrasion resistant coating layer 610. In this embodiment, the abrasion resistant coating layer 610 is applied with a thickness of approximately 4.4 microns. Thus, the abrasion resistant coating layer 610 may be reduced as a result of the edge prep and polishing of block 614, to approximately 4 microns. For an abrasion resistant coating layer 610 of 5 microns for example, the heavy layer of the abrasion resistant coating layer 610 should be applied with a thickness of more than 5 microns to take into account of any coating layer removal during edge prep and polishing. The terms "abrasion resistant coating layer," "first coating layer," and "bottom layer" may be used interchangeably herein.

The abrasion resistant coating layer 610 may be applied via a physical vapor deposition (PVD) process, such as cathodic arc deposition, to form a hard PVD coating layer comprising a chemical composition which has inertness toward titanium or titanium alloy. The applied hard PVD coating (i.e., a bottom layer 610) of the thin-film coating is applied in excess of ~4-5 microns. The applied PVD coating may not be applied in excess when using some PVD technologies, such as High Power Impulse Magnetron Sputtering (HiPIMS) variants. In this example, the bottom layer 610 comprises zirconium silicon carbon nitride (ZrSiCN) shown magnified based on a factor of 10,000. Furthermore, the adhesive layer 608 is illustrated as titanium of approximately 500 nanometers. The adhesive layer 608 may be zirconium as well.

With reference to FIG. 6B, the method 600 may include, at block 614, edge-prepping and polishing the top surface 611 of the bottom layer 610 of the coating on the cutter tool. Additionally, the polished intermediate surface on an edge of the cutter tool may be configured to reorient cutting forces. The cutting edge is smooth such that the cutting edge is generally free of grind lines or nearly free of grind lines.

The method 600 may include, at block 618, applying the friction reducing coating or top layer 620 to the prepped and polished top surface of the bottom layer 610. The top layer 620 is a friction reducing coat of approximately 0.5-1.0 microns with chemical inertness toward titanium or titanium alloy. In some embodiments, the friction reducing coating or top layer 620 may have a chemical composition with inertness toward titanium (Ti). The top layer 620 may include one of tungsten disulfide ($WS_2$), hexagonal boron nitride (h-BN), or diamond like carbon (DLC) variant. The method for applying the hexagonal boron nitride (h-BN) will be described in relation to FIGS. 7A and 7B. The method described in FIG. 7A for hexagonal boron nitride application can be also used for tungsten disulfide may be applied as a solid lubricant. The hexagonal boron nitride (h-BN) may be applied using Plasma Immersion Ion Deposition (PIID) technique or radio frequency (RF) sputtering. PIID is a Plasma Enhanced Chemical Deposition (PECVD) technique, whereas Radio frequency (RF) sputtering is a PVD application technique. In this example, the hexagonal boron nitride (h-BN) has a thickness of approximately 0.5-0.6 microns. The top layer 620 is shown magnified based on a factor of 20,000.

The method 600 may include, at block 622, machining or milling with the coated end mill cutter tool mounted to a cutting tool device and a metal object comprising titanium or titanium alloy, as shown in image 630.

The thin-film coating described herein may be applied to other cutter tools in order to create a suite of titanium machining tools, for example.

Surface modification in block 614 may include both texturing and polishing specific surface areas of the end mill cutter tool. The current edge prep process allows the cutter tool to be polished 20 microns away from the cutting edge, while allowing the manufactured grind lines within the flute to act as solid lubricant reservoirs from the deposited top layer 620. In some embodiments, laser texturing may be used at block 614.

The size of the edge-prep (EP) may be 10-20 microns. The 10-20 microns corresponds to the radius size of the cutting edge. Before the edge-prep process, the cutting edge typical does not have a definable radius size. After the edge-prep the cutting becomes "rounded" with a definable radius size. The EP allows for a greater percentage of cutting force to be reoriented within the tool, thereby keeping the carbide end mill cutter tool in compression rather than in tension. By way of non-limiting example, the edge prep cutting edge may be an engineered hone such as a waterfall hone by Conicity Technologies™.

Figure 7A:
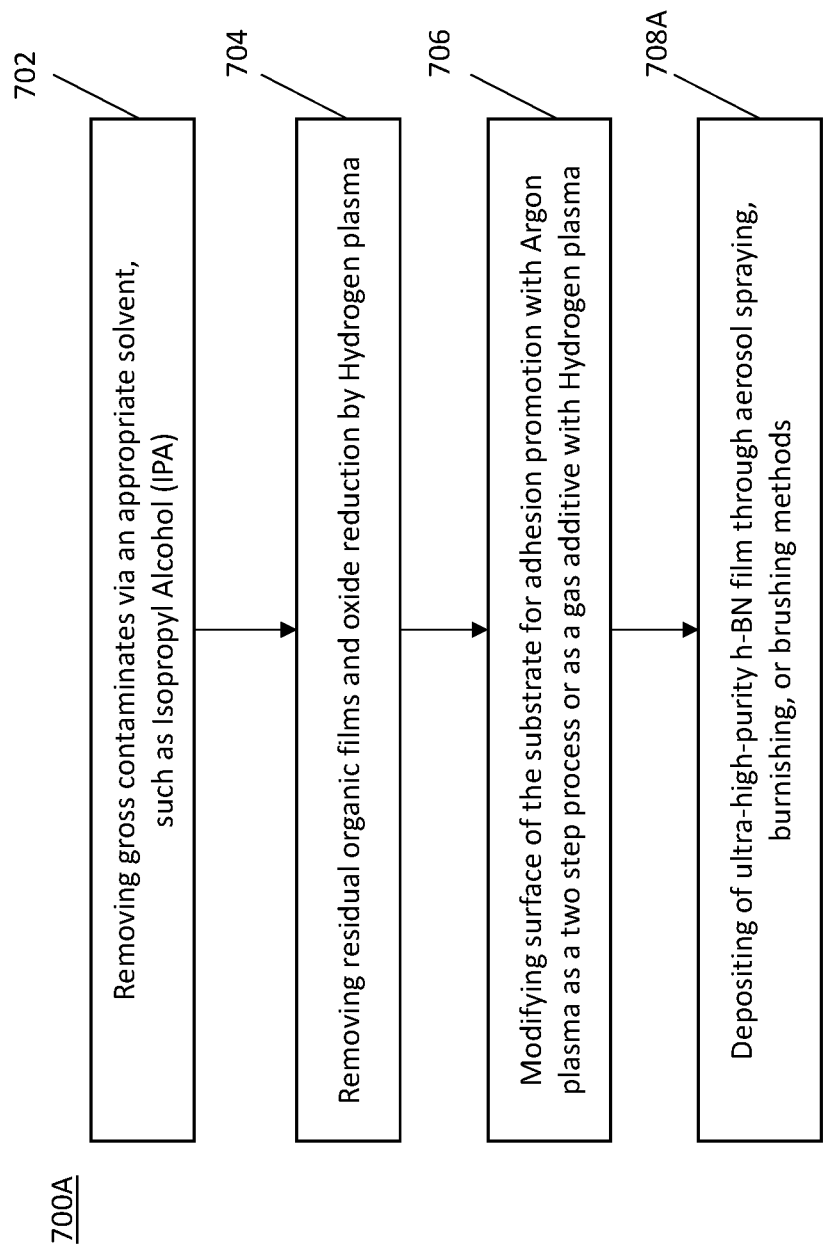
FIGS. 7A and 7B illustrate methods for forming a top layer of the tribologically optimized (TO) cutter tool.

FIG. 7A illustrates a method 700A for forming a top layer of the tribologically optimized (TO) cutter tool. The hexagonal boron nitride (h-BN) or tungsten disulfide ($WS_2$) may be applied to an existing hard PVD base coat, such as an AlCrN-based coating layer or ZrN-based coating layer.

At block 702, the method 700A may include removing of gross contaminants via an appropriate solvent, such as isopropyl alcohol (IPA). At block 704, the method 700A may include removing residual organic films and oxide reduction by hydrogen plasma. At block 706, the method 700A may include modifying a surface of the substrate for adhesion promotion. By way of non-limiting example, the modification process may use argon plasma such as in a two-step process. The modification process may include a gas additive with hydrogen plasma. At block 708A, the method may include depositing ultra-high-purity h-BN film. The depositing may be accomplished through one of aerosol spraying, burnishing, or brushing methods.

Improved performance of the cutter tool is achieved by modifying the hard PVD coating surface by means of an appropriately controlled post-coat polishing treatment. The post-coat polishing treatment can effectively remove grind lines near the cutting edge, lessen surface roughness, and remove burrs, as would be performed during the method 700A.

The addition of a solid lubricant layer or film, such as h-BN, is paramount in sealing any surface defects from applying the hard PVD coating and from the post-coat polishing/edge-preparation which may expose the carbide. The deposition of h-BN may be needed in order to prevent metal-on-metal contact, especially on the cutting edge of the tool. The prevention of metal-on-metal contact allows for improved anti-galling and fretting properties.

The performance of hexagonal boron nitride (h-BN) as a solid lubricant is strongly dependent upon the material existing in a particular crystal structure. The desired crystal structure for lubrication should be hexagonal. Cubic or amorphous crystal structure will greatly diminish the ability of the material to lubricate during operation. Specifically, cubic or amorphous crystal structure of BN will decrease the coefficient of friction (CoF) against titanium counterfaces mainly due to the c-BN film's hardness. Hexagonal BN (h-BN) decreases the CoF against titanium counterfaces by a different mechanism, namely weak bonding between h-BN planes (i.e., basal plane) allowing them to easily slide against one another. While c-BN and a-BN have shown to be beneficial as a top coat on a cutter tool, the adhesion is poorer than what has been achieved with h-BN films, described herein. The inventor has discovered that poor adhesion of c-BN makes c-BN particularly difficult to use as a PVD coating thus affecting the adhesion of the c-BN or the a-BN to any layers to which it is adhered and the ability to reduce friction during operation.

The crystal structure determines the lubricating mechanism both with c-BN and h-BN. The h-BN basal planes are strongly bonded with on another horizontally, but weakly bonded between top and bottom planes. These weakly bonded basal planes allow for easy sliding. The film thickness is what is important for this monolithic structure. Namely, 500 nm (nanometers) to 1 micron (micrometer).

Furthermore, it is difficult to produce high quality, adherent c-BN films using a PVD process due to a very narrow window of operating parameters that can be used and must be found experimentally. Once c-BN is formed on the substrate, the hardness and compressive stress within the film prevents good adhesion onto the substrate. Typically, only very thin-films of a few nanometers (nm) can be deposited before delamination occurs. Therefore, depositing h-BN allows a thicker layer to be achieved for improved useful life.

Figure 7B:
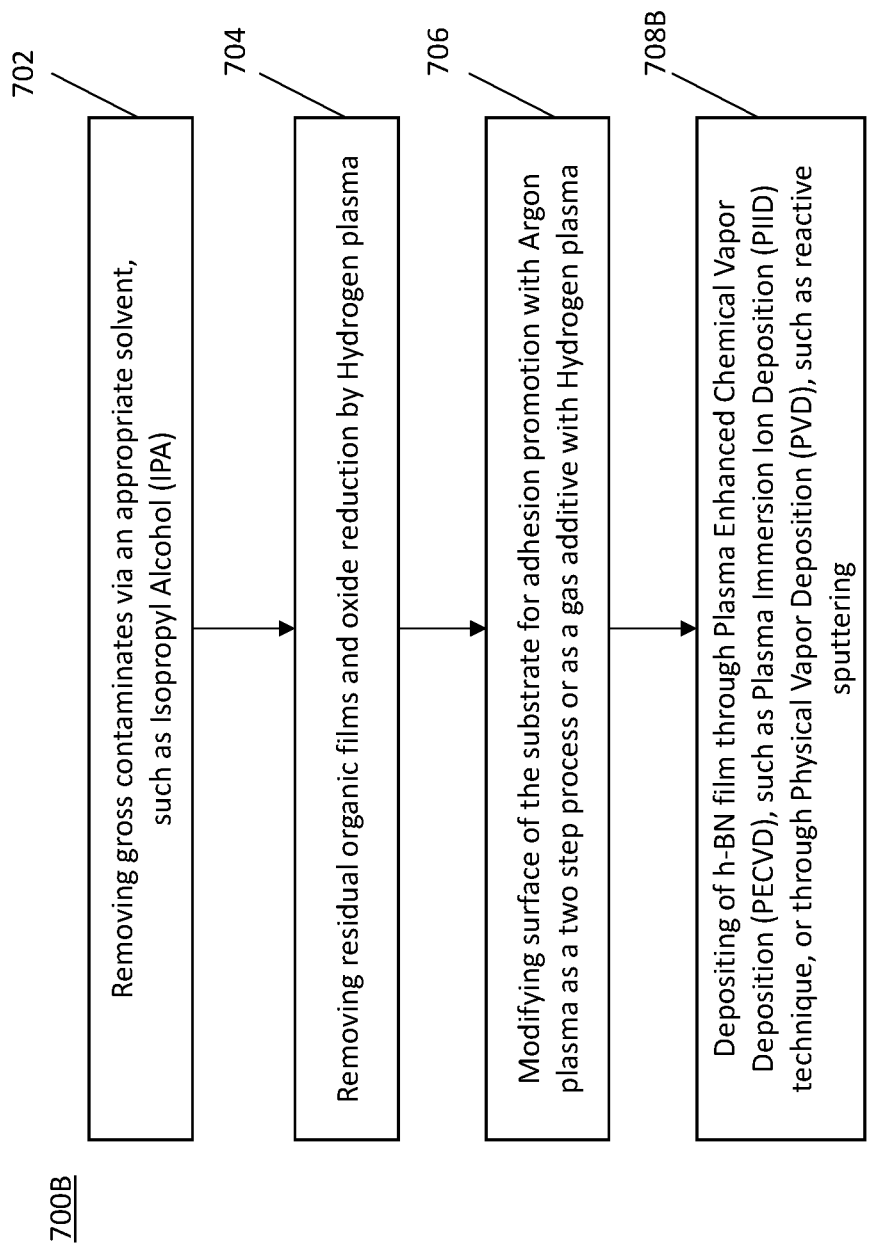

FIG. 7B illustrates a method 700B for forming a top layer of the tribologically optimized (TO) cutter tool. The hexagonal boron nitride (h-BN), tungsten disulfide (WS$_2$) or DLC variant may be applied to an existing hard PVD base coat, such as an AlCrN-based coating layer or ZrN-based coating layer. The steps of method 700B is essentially the same as the block of method 700A. Thus, only the changes will be described in detail. The methods 700A and 700B differ in the steps 708A and 708B. The DLC variant may be applied as a plasma and forms a solid lubricant.

At block 708B, the method 700B may include depositing of h-BN, tungsten disulfide, or DLC film through plasma enhanced chemical vapor deposition (PECVD), such as by way of non-limiting example, plasma immersion ion deposition (PIID) technique or through physical vapor deposition (PVD), such as reactive sputtering.

Figure 8:
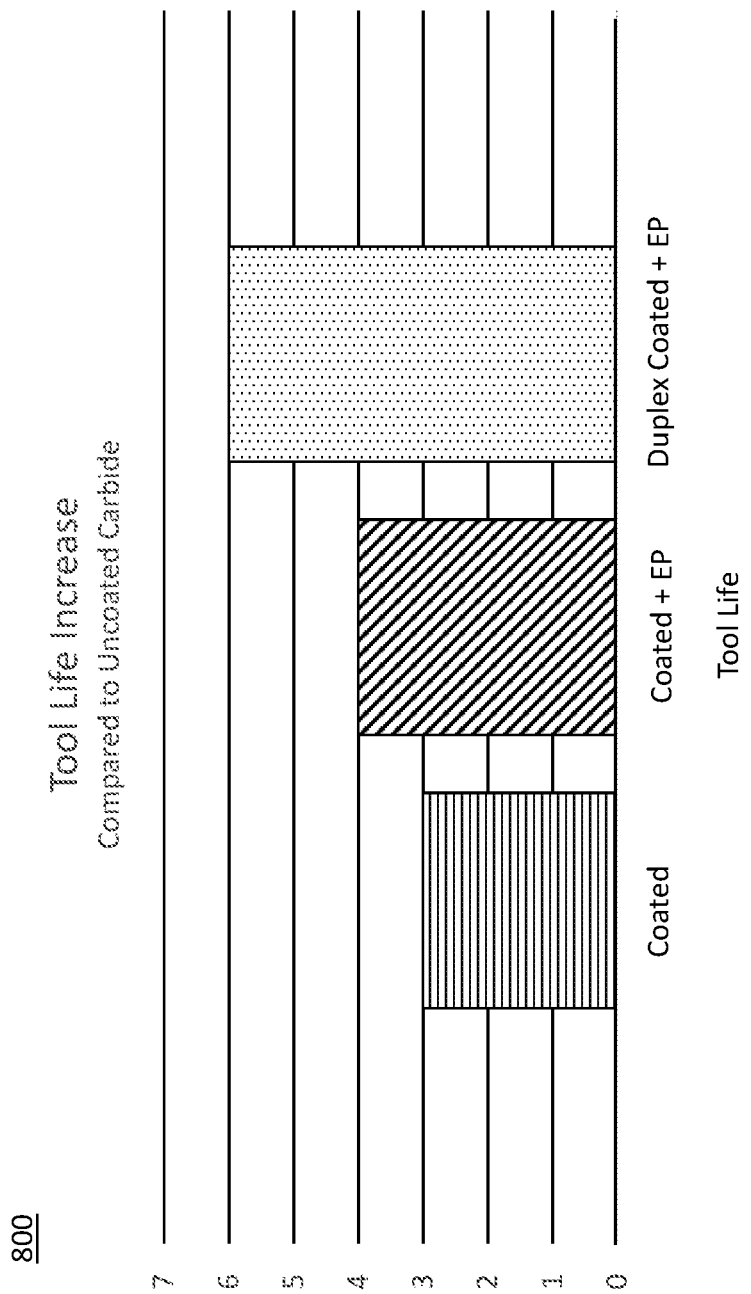
FIG. 8 illustrates a bar graph representative of a useful life increase of the tribologically optimized (TO) cutter tool.

FIG. 8 illustrates a bar graph 800 representative of a useful life increase of the tribologically optimized (TO) cutter tool described herein. The inventors have determined an increase in cutter tool life over a standard uncoated carbide substrate. The inventors have determined an increase in cutter tool life over a hard coating with edge prepping of a carbide substrate. A coated tool is coated with a hard coating only. The tool life of a coated tool is represented by the bar with a straight-line hatch pattern. The tool life of a coated tool with a coating plus being edge prepped (EP) is denoted by the bar with a diagonal-line hatch pattern. The duplex coated tool with EP includes a hard coating, friction reducing coating and edge-prep. The tool life of the duplex coated tool is represented by the bar with a dotted hatch pattern.

The same parameters for measuring tool life was used across each tool type. The end mill tool types include a coated tool, coated EP tool, duplex coated plus EP tool and uncoated carbide end mill tool. The tool life for each of the coated end mill tool is compared to the uncoated carbide end mill tool. The coated end mill tool has a tool life of approximately 3, relative to the uncoated carbide end mill. The coated end mill tool plus EP has a tool life of approximately 4, relative to the uncoated carbide end mill tool. The coated end mill tool with a duplex coating plus EP has a tool life of approximately 6, relative to the uncoated carbide end mill tool. The duplex coated plus EP end mill tool has a tool life which is approximately 6 times the tool life of an uncoated carbide. Furthermore, the duplex coated plus EP end mill tool has a tool life which is approximately 2 times the tool life of the coated end mill tool. The duplex coated plus EP end mill tool has a tool life which is approximately 1.5 times the tool life of the coated end mill tool plus EP.

Figure 9:
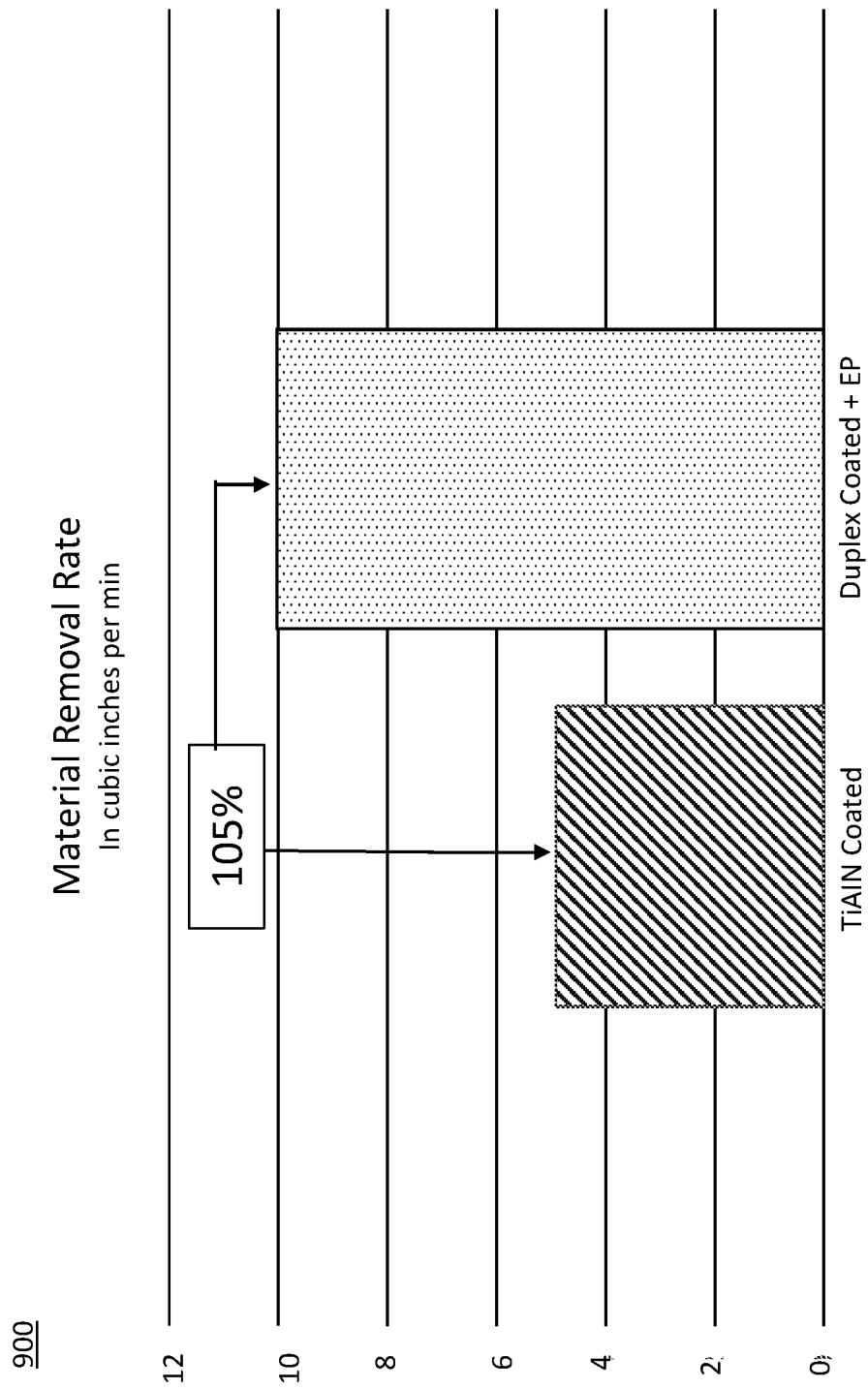
FIG. 9 illustrates a bar graph representative of material removal rate for the TO cutter tool.

FIG. 9 illustrates a bar graph 900 representative of material removal rate (MMR) for the TO cutter tool. The tribologically optimized (TO) cutter tool described herein has a 105% increase over a cutter tool with a known hard coating with a significant increase of cutter tool life. The duplex coated plus EP end mill tool was compared to an end mill tool coated with TiAlN (titanium aluminum nitride). TiAlN is a known industry standard. The duplex coated plus EP end mill tool is represented as a bar with a dotted hatch pattern. The TiAlN coated tool is represented as a bar with a diagonal-line hatch pattern.

The duplex coating of the duplex coated plus EP tool included an (aluminum chromium nitride) AlCrN-based hard coating and a h-BN friction reducing coating. The duplex coated tool was also edge-prepped (EP).

The TiAlN coated end mill tool was subjected to the cutting parameters of Table 1 for measuring the MMR.

TABLE 1

| Cutting Parameters | TiAlN coated end mill tool |
| --- | --- |
| Feed rate | 0.0074 ipt (inches per tooth) |
| WOC (Width of Cut) | 0.040" |
| DOC (Depth of Cut) | 1.625" |
| Speed | 400 sfm (surface feet per minute) |
| Tool life | 20 minutes |

The duplex coated plus EP end mill tool was subjected to the cutting parameters of Table 2.

TABLE 2

| Cutting Parameters | Duplex coated plus EP end mill tool |
|---|---|
| Feed rate | 0.0119 ipt (inches per tooth) |
| WOC (Width of Cut) | 0.025" |
| DOC (Depth of Cut) | 2.00" |
| Speed | 400 sfm (surface feet per minute) |
| Tool life | 120 minutes |

Figure 10:
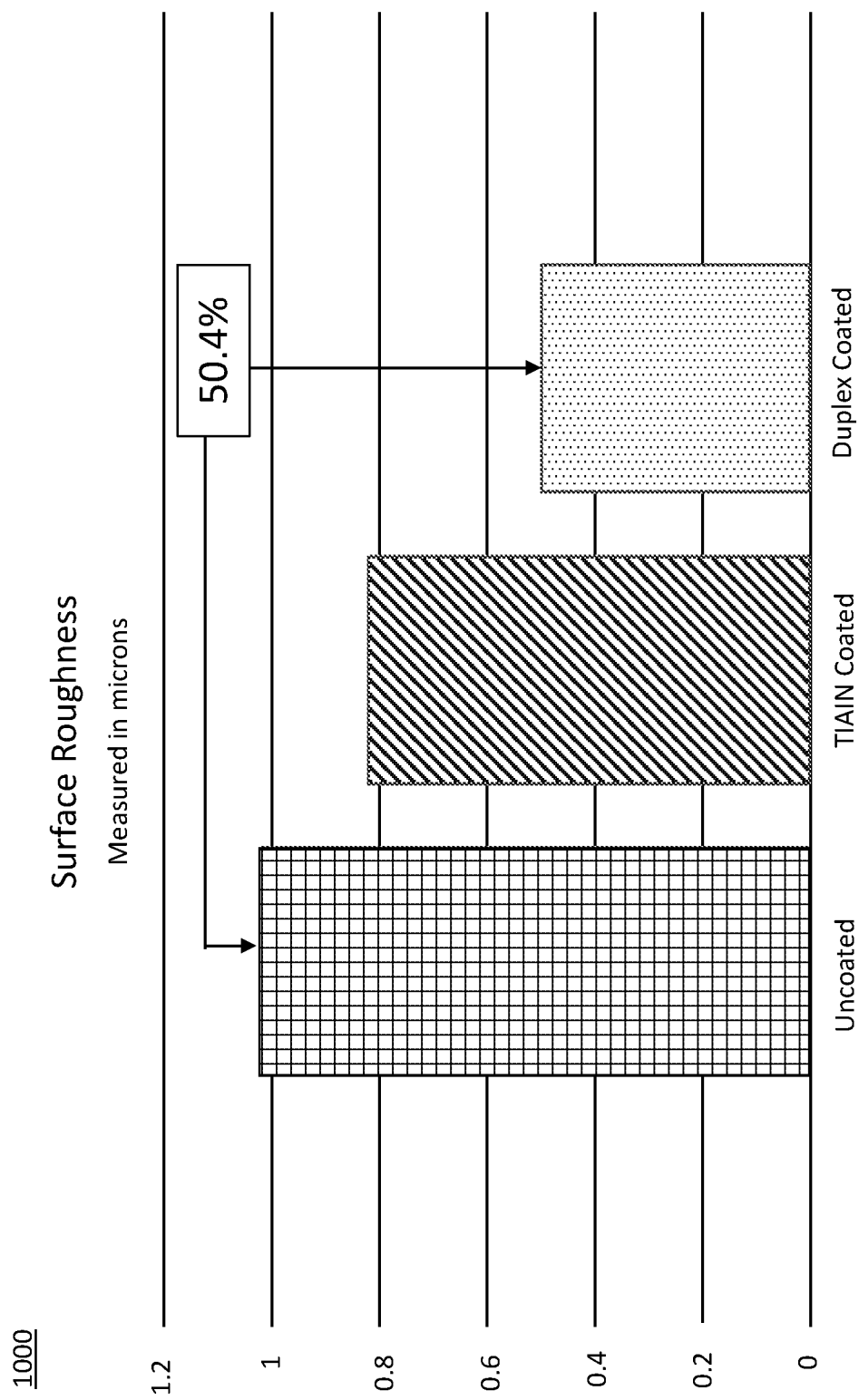
FIG. 10 illustrates a bar graph representative of surface roughness of machined workpiece using the TO cutter tool.
Figure 11:
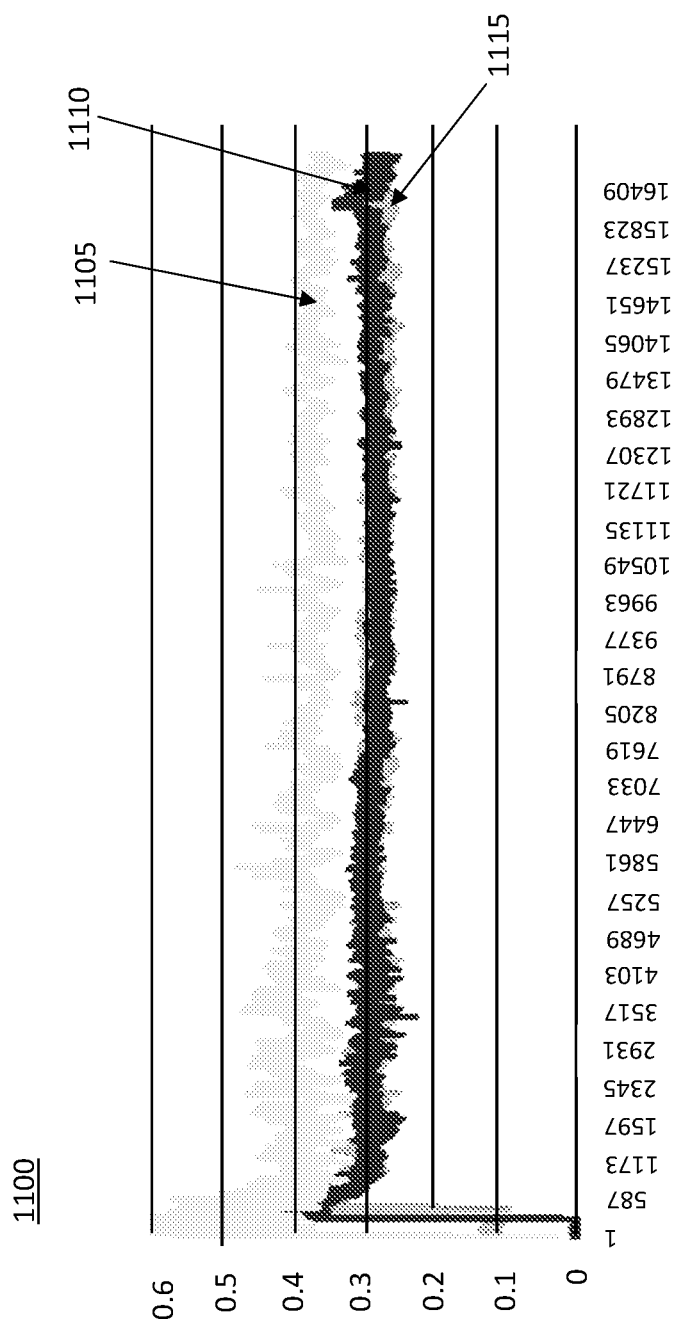
FIG. 11 illustrates a graph representative of a frictional response of the coating of the TO cutter tool.

FIG. 10 illustrates a bar graph 1000 representative of surface roughness of a machined workpiece for the TO cutter tool. The bar graph represents approximately a 50% reduction in surface roughness of a milled surface created by the TO cutter tool as compared to uncoated end mill tool. Surface roughness measured in Ra with profilometer wherein Ra is the arithmetic average of the absolute values of the profile height deviations from the mean line, recorded with the evaluation length. The surface roughness of a machined workpiece by an uncoated end mill is represented as a bar with a checkered hatch pattern. The surface roughness of a workpiece machined by an end mill tool with a TiAlN coating is represented as a bar with diagonal-line hatch pattern. The surface roughness associated with end mill tool with the duplex coating with EP as described herein is represented as a bar with dotted hatch pattern. All end mills were running at the same test parameters FIG. 11 illustrates a graph 1100 representative of current coating material frictional response relative to the duplex coating of the TO cutter tool. The graph 1100 shows the frictional responses of the topcoats ($WS_2$ and h-BN) as compared to AlCrN-based coating only. The signal graph line 1105 (light grey) represents the frictional response associated with the coefficient of friction (COF) of the AlCrN-based coating. Graph line 1110 (black) represents the frictional response associated with the coefficient of friction (COF) of the h-BN-based coating used in the duplex coating plus EP end mill tool.

Graph line 1115 (grey) represents the frictional response associated with the WS2-based coating used in the duplex coating plus EP end mill tool. The graph line 1115 closely tracks the graph line 1110.

Figures 12A, 12B:
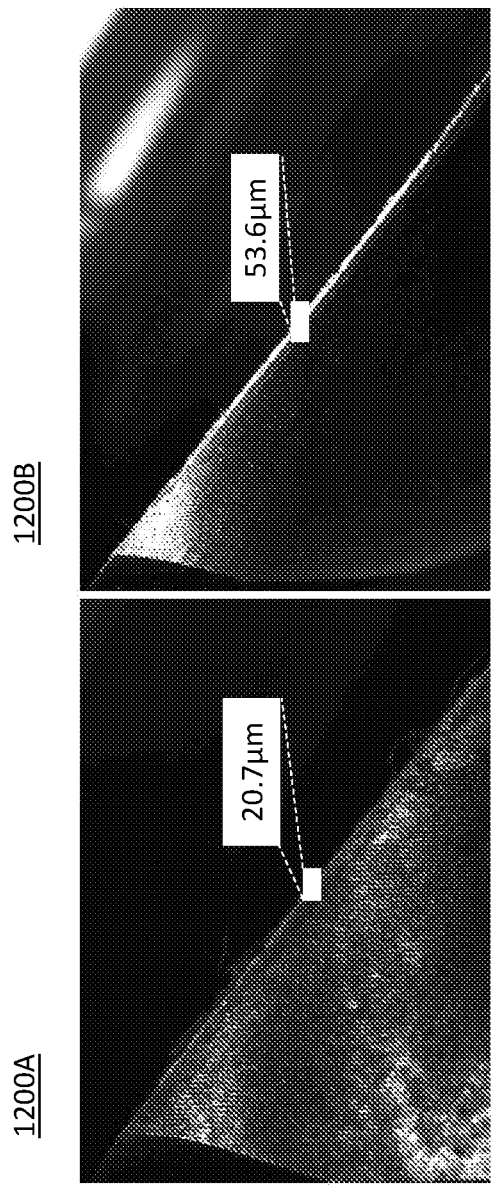
FIG. 12A illustrates an image representative of a wear width of the TO cutter tool.
FIG. 12B illustrates an image representative of a wear width of the conventional cutter tool.

FIG. 12A illustrates an image 1200A representative of a wear width of the TO cutter tool with the h-BN top coat described herein. FIG. 12B illustrates an image 1200B representative of a wear width of an AlCrN-based coated cutter tool without the h-BN additional top coat. In FIG. 12A, the wear width is approximately 20.7 microns (μm). In FIG. 12B, the wear width is approximately 53.6 microns (μm). The measurement shown in FIGS. 12A and 12B was conducted using the same test parameters such as, by way of non-limiting example, same rate of milling, same object material, and same length of time of milling. As can be seen from the wear width results, the wear width of the TO cutter tool with the h-BN addition is more than 40% less than the wear of the conventional cutter tool.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present disclosure in any way.

Therefore, the breadth and scope of the subject matter provided herein should not be limited by any of the above explicitly described embodiments. Rather, the scope of the embodiments should be defined in accordance with the following claims and their equivalents.

I claim:

1. A method comprising:
applying to an end mill an abrasion-resistant bottom coating (ARBC) layer on an outer perimeter surface of the end mill, the ARBC layer has chemical inertness toward titanium or titanium alloy; edge-prepping and polishing a top surface of the ARBC layer to form a polished ARBC layer with reoriented cutting forces, wherein the edge-prepping at least partially comprises altering one or more portions of one or more cutting edges of the end mill to a generally rounded configuration; and
applying a friction reducing coating (FRC) layer to the top surface of the polished ARBC layer to form a thin-film coating which has chemical inertness to the titanium or the titanium alloy.

2. The method of claim 1, wherein the ARBC layer comprises a physical vapor deposition (PVD) layer comprising one of aluminum chromium nitride (AlCrN) based chemical composition and zirconium nitride (ZrN) based chemical composition.

3. The method of claim 2, wherein the polished ARBC layer has a thickness in a range of approximately 4-5 microns.

4. The method of claim 1, wherein the polished ARBC layer with the reoriented cutting forces being configured to keep the end mill in compression.

5. The method of claim 1, wherein the FRC layer has a thickness in a range of approximately 0.5 -1.0 microns.

6. The method of claim 1, wherein the FRC layer includes one of tungsten disulfide ($WS_2$), hexagonal boron nitride (h-BN), or diamond like carbon (DLC) variant.

7. The method of claim 1, further comprising:
cleaning the outer perimeter surface of the end mill of oxides resulting from exposure of the end mill to an ambient environment;
altering a secondary relief of the cleaned end mill to modify a facet to a standard style relief of the flank face to form an altered end mill; and
applying an adhesive layer to the altered end mill prior to applying the ARBC layer.

8. The method of claim 7, wherein the adhesive layer comprises one of titanium or zirconium.

9. A cutter tool comprising:
an end mill having an altered secondary relief with a standard style relief; and a duplex coating applied to the end mill having a bottom layer comprising an abrasion-resistant bottom coating (ARBC) wherein the bottom layer has an edge-prep and polished top surface, wherein the edge-prep at least partially comprises an alteration of one or more portions of one or more cutting edges of the end mill to a generally rounded configuration; and
a top layer comprising a friction reducing coating applied to the top surface of the bottom layer, the duplex coating includes a chemical composition which is inert toward titanium or titanium alloy to prevent or minimize titanium or titanium alloy adhesion to the end mill during milling operations of a metal object comprising the titanium or titanium alloy.

10. The cutter tool of claim 9, wherein the bottom layer comprises a physical vapor deposition (PVD) layer comprising one of an aluminum chromium nitride (AlCrN) based chemical composition and zirconium nitride (ZrN) based chemical composition.

11. The cutter tool of claim 10, wherein the bottom layer has a thickness in a range of approximately 4-5 microns.

12. The cutter tool of claim 9, wherein the top surface of the bottom layer is configured to reorient cutting forces.

13. The cutter tool of claim 9, wherein the top layer is approximately 0.5-1.0 microns.

14. The cutter tool of claim 9, wherein the top layer includes one of tungsten disulfide ($WS_2$), hexagonal boron nitride (h-BN), or diamond like carbon (DLC) variant.

15. The cutter tool of claim 9, wherein the top layer forms a solid lubricant.

16. The cutter tool of claim 9, further comprising an adhesive layer applied to the end mill to adhere the coating to the end mill.

17. A coating comprising:
a bottom layer comprising a hard physical vapor deposition (PVD) coating applied to an end mill wherein the bottom layer has an edge-prep and polished top surface to reorient cutting forces, wherein the edge-prep at least partially comprises an alteration of one or more portions of one or more cutting edges of the end mill to a generally rounded configuration; and
a top layer comprising a friction reducing coating applied to the top surface of the bottom layer, both the bottom layer and the top layer having a chemical composition which has inertness toward titanium or titanium alloy to prevent or minimize titanium or titanium alloy adhesion to the end mill during milling operations of a metal object comprising the titanium or titanium alloy.

18. The coating of claim 17, wherein the bottom layer comprises one of an aluminum chromium nitride (AlCrN) based chemical composition and zirconium nitride (ZrN) based chemical composition.

19. The coating of claim 18, wherein the bottom layer has a thickness in a range of approximately 4-5 microns.

20. The coating of claim 17, wherein the top layer has a thickness in a range of approximately 0.5-1.0 microns.

21. The coating of claim 17, wherein the top layer includes one of tungsten disulfide ($WS_2$), hexagonal boron nitride (h-BN), or diamond like carbon (DLC) variant.

22. The coating of claim 17, wherein the top layer comprises a crystal structure to form a solid lubricant.

* * * * *